United States Patent [19]
Lin et al.

[11] Patent Number: 5,976,935
[45] Date of Patent: Nov. 2, 1999

[54] METHOD OF FABRICATING AN ELECTRICALLY ERASABLE AND PROGRAMMABLE READ-ONLY MEMORY (EEPROM) WITH IMPROVED QUALITY FOR THE TUNNELING OXIDE LAYER THEREIN

[75] Inventors: Ying-Jen Lin; Joe Ko, both of Hsinchu; Gary Hong, Hsin-Chu, all of Taiwan

[73] Assignee: United Semiconductor Corp., Hsinchu, Taiwan

[21] Appl. No.: 09/149,587

[22] Filed: Sep. 8, 1998

[30] Foreign Application Priority Data

Jul. 16, 1998 [TW] Taiwan .................................. 87111580

[51] Int. Cl.$^6$ ................................................ H01L 21/336
[52] U.S. Cl. .......................... 438/264; 438/258; 438/592; 438/594
[58] Field of Search ...................... 438/264, 257, 438/258, 263, 594, 593, 592, 201, FOR 203, FOR 212, 211

[56] References Cited

U.S. PATENT DOCUMENTS

| | | | |
|---|---|---|---|
| 4,851,361 | 7/1989 | Schumann et al. ..................... | 438/201 |
| 5,591,658 | 1/1997 | Cacharelis ................................ | 438/264 |
| 5,637,520 | 6/1997 | Cappelletti et al. ..................... | 438/258 |
| 5,679,970 | 10/1997 | Hartmann ................................ | 257/320 |
| 5,714,412 | 2/1998 | Liang et al. ............................ | 438/594 |
| 5,793,081 | 8/1998 | Tomioka et al. ........................ | 257/316 |

*Primary Examiner*—Michael Trinh
*Attorney, Agent, or Firm*—Hickman Stephens & Coleman

[57] ABSTRACT

A method is provided for fabricating an EEPROM (EEPROM (electrically erasable and programmable read-only memory) device, which can help improve the quality of the tunneling oxide layer in the EEPROM device for reliable operation of the EEPROM device. This method is characterized in that the portion of the tungsten silicide (WSi) layer that is directly laid above the tunneling oxide layer is removed, while still allowing all the other part of the tungsten silicide layer to remain unaltered. As a result, in the subsequent heat-treatment process, the degradation in the quality of the tunneling oxide layer that occurs in the prior art due to the forming of a trapping center therein can be prevented. The tunneling oxide layer is thus more assured in quality, allowing the resultant EEPROM to operate reliably with high performance.

8 Claims, 3 Drawing Sheets

METHOD OF FABRICATING AN ELECTRICALLY ERASABLE AND PROGRAMMABLE READ-ONLY MEMORY (EEPROM) WITH IMPROVED QUALITY FOR THE TUNNELING OXIDE LAYER THEREIN

CROSS-REFERENCE TO RELATED APPLICATION

This application claims the priority benefit of Taiwan application serial no. 87111580, filed Jul. 16, 1998, the full disclosure of which is incorporated herein by reference.

BACKGROUND OF THE INVENTION

1. Field of the Invention

This invention relates to semiconductor fabrication technologies, and more particularly, to a method for fabricating an EEPROM (electrically erasable and programmable read-only memory) device with improved quality for the tunneling oxide layers therein.

2. Description of Related Art

An EEPROM (electrically erasable and programmable read-only memory, also abbreviated as $E^2PROM$) is a semiconductor, nonvolatile, programmable read-only memory device whose contents can be electrically erased and then selectively rewritten without having to remove it from its host circuit board. Due to the erasable and programmable feature, the EEPROM is more versatile in utilization than other types of ROMs. In the EEPROM device, the data erasure and rewrite operation can be carried out one bit at a time. A conventional single-polysilicon EEPROM device is illustratively depicted in the following with reference to FIGS. 1A–1C.

FIG. 1A shows the first step, in which a semiconductor substrate 10 is prepared. A field oxide layer 11 is then formed in a selected area. A first oxide layer 12 is subsequently formed over the entire top surface of the substrate 10 and the field oxide layer 11. The first oxide layer 12 is then selectively removed so as to form a tunneling window 13, exposing a selected area on the substrate 10. Next, a second oxide layer 14 is formed over the entire top surface of the wafer, including the entire first oxide layer 12 and filling the tunneling window 13. The part of the second oxide layer 14 that is laid in the tunneling window 13, as indicated by the reference numeral 14b, serves as a tunneling oxide layer; all the other parts of the second oxide layer 14 and its underlying first oxide layer 12 serve in combination as a gate oxide layer, here collectively indicated by the reference numeral 14a.

FIG. 1B shows the subsequent step, in which a polysilicon layer 15 and a tungsten silicide (WSi) layer 16 are successively formed over the entire top surface of the wafer through, for example, two respective chemical-vapor deposition (CVD) processes. The polysilicon layer 15 and the WSi layer 16 are then selectively removed, allowing the remaining portions of these two layers 15 and 16 that are laid over the tunneling oxide layer 14b on one side of the field oxide layer 11 to serve as a floating gate 17, while the remaining portions of the same over the gate oxide layer 14a on the other side of the field oxide layer 11 serve as a gate 18.

FIG. 1C shows the subsequent step, in which a high-voltage ion-implantation (HVI) process is performed on the wafer with the field oxide layer 11, the floating gate 17, and the gate 18 serving as a mask. A heat-treatment process is then performed on the wafer. Through these two processes, impurity ions are implanted and driven into the unmasked portions of the substrate 10 to form a pair of source/drain regions 19 in the substrate 10 on both sides of the gate 18.

In the foregoing method, the floating gate 17 is formed from a combination of the WSi layer 16 and the underlying polysilicon layer 15. Since the WSi layer 16 is customarily formed through CVD process, remnant fluorine (F) or chlorine (Cl) atoms can be left in the WSi layer 16. A bad consequence of this can occur when the WSi layer 16 is heated in the subsequent heat-treatment process used to drive ions into the source/drain regions, because stress can occur in the heated WSi and the remnant fluorine or chlorine atoms in the WSi layer 16 can be diffused into the tunneling oxide layer 14b. This turns the tunneling oxide layer 14b into a trapping center. During operation of the EEPROM device, the electric charges caught in the trapping center cause uneven and inconsistent electric fields in the tunneling oxide layer 14b, which easily causes breakdown in the tunneling oxide layer 14b. The reliability of the resultant EEPROM device is thus degraded.

SUMMARY OF THE INVENTION

It is therefore an objective of the present invention to provide a method for fabricating an EEPROM device, which can help prevent the tunneling oxide layer from turning into a trapping center in the heat-treatment process so that the quality of the tunneling oxide layer is more carefully controlled.

It is another objective of the present invention to provide a method for fabricating an EEPROM device, which can help improve the quality of the tunneling oxide layer formed in the EEPROM device, and also allow the EEPROM device to operate reliably without being degraded in performance.

In accordance with the foregoing and other objectives of the present invention, a new method for fabricating an EEPROM device is provided. The method of the invention includes the following steps:

(1) preparing a substrate of a first semiconductor type, then forming a field oxide layer on the substrate;

(2) forming a first oxide layer over the substrate, when is then selectively removed to form a tunneling window to expose a selected area on the substrate;

(3) forming a second oxide layer, which covers the first oxide layer and the area of the substrate exposed by the tunneling window, with the part of the second oxide layer that is laid in the tunneling window serving as a tunneling oxide layer, and all the other part of the second oxide layer and the underlying first oxide layer serving as a gate oxide layer;

(4) forming a polysilicon layer, which covers over the entire gate oxide layer and the tunneling oxide layer, and then forming a layer of tungsten silicide over the entire polysilicon layer;

(5) removing a selected portion of the tungsten silicide layer that is laid directly above the tunneling oxide layer;

(6) removing selected portions of the polysilicon layer and the underlying tungsten silicide layer so as to form a floating gate on the tunneling oxide layer and a gate on the gate oxide layer; and (7) performing an HVI process so as to dope an impurity element of a second semiconductor type into the substrate, and then performing a heat-treatment process so as to form a pair of source/drain regions in the substrate on both sides of the gate.

The foregoing method of invention is characterized in that the portion of the WSi layer that is directly laid above the tunneling oxide layer is removed. As a result, in the subsequent heat-treatment process, the degradation in the quality of the tunneling oxide layer that occurs in the prior art due to the forming of a trapping center therein can be prevented. The quality of the tunneling oxide layer is thus more controlled, allowing the resultant EEPROM to operate reliably with high performance.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

FIGS. 2A–2E are schematic sectional diagrams used to depict the steps involved in the method according to the invention for fabricating a single-polysilicon EEPROM device on a semiconductor substrate. In the following preferred embodiment, the semiconductor substrate is a P-type silicon substrate, but it is to be noted that the semiconductor substrate can also be N-type and selected from various other kinds of semiconductor materials.

Figure 1A:
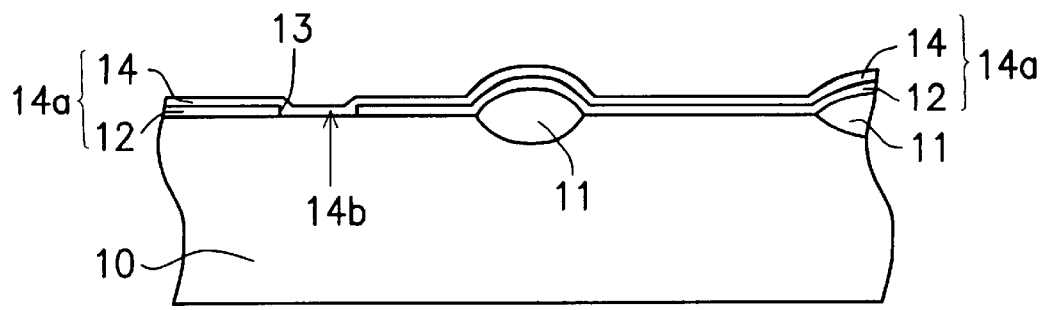
FIGS. 1A–1C are schematic sectional diagrams used to depict the steps involved in a conventional method for fabricating an EEPROM device.
Figure 1B:
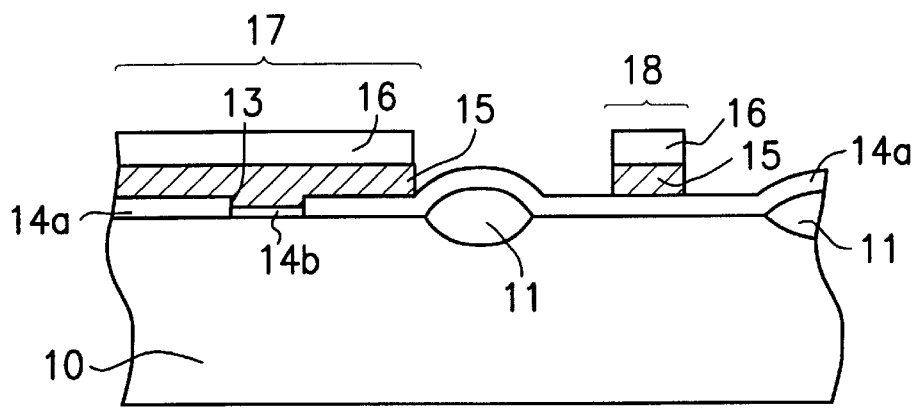
Figure 1C:
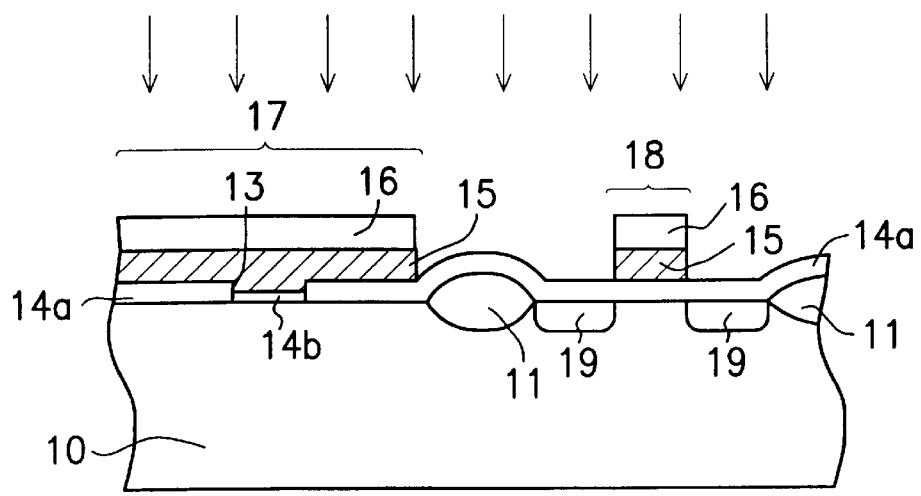
Figure 2A:
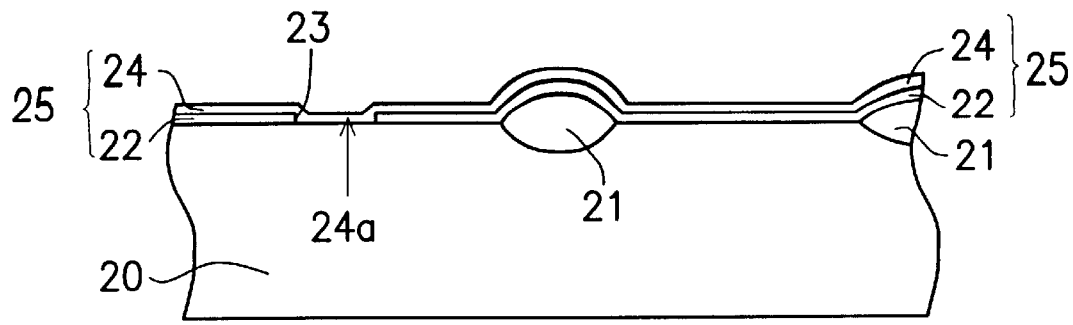
FIGS. 2A–2E are schematic sectional diagrams used to depict the steps involved in the method according to the invention for fabricating an EEPROM device.

FIG. 2A shows the first step, in which a semiconductor substrate 20 of a first semiconductor type, such as a P-type silicon substrate, is prepared. A field oxide layer 21 is then formed on a selected area. Subsequently, a first oxide layer 22, such as a layer of silicon dioxide, is formed through CVD process over the entire top surface of the substrate 20 and the field oxide layer 21. The first oxide layer 22 is then selectively removed so as to form a tunneling window 23 to expose a selected area on the substrate 20. Next, a second oxide layer 24, such as a layer of silicon dioxide, is formed through CVD process over the entire top surface of the wafer to a thickness of about 80 Å (angstroms). The second oxide layer 24 covers the entire first oxide layer 22 and fills the tunneling window 23. The part of the second oxide layer 24 that fills the tunneling window 23, indicated by the reference numeral 24a, serves as a tunneling oxide layer, all the other parts of the second oxide layer 24 and its underlying first oxide layer 22 serve in combination as a gate oxide layer, here collectively indicated by the reference numeral 25.

Figure 2B:
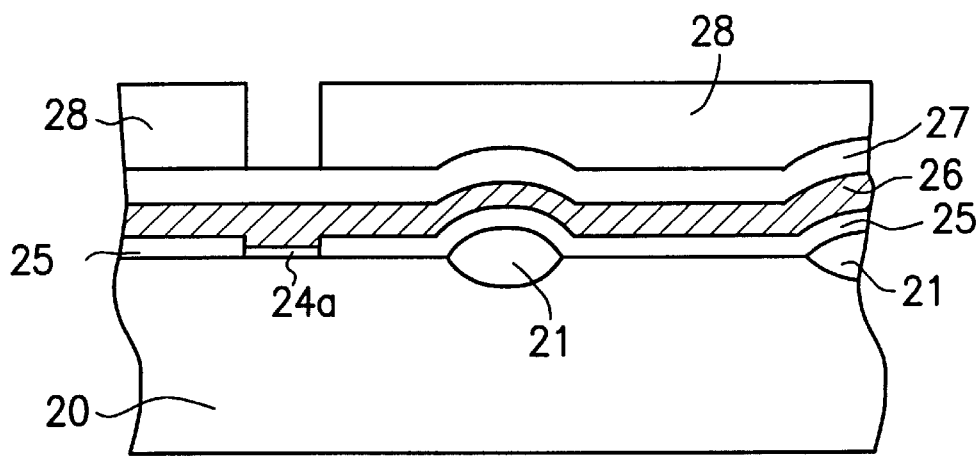

FIG. 2B shows the subsequent step, in which a polysilicon layer 26 is formed over the entire top surface of the wafer. A layer of tungsten silicide (WSi) 27 is then formed over the entire polysilicon layer 26. Both the polysilicon layer 26 and the WSi layer 27 can be formed through CVD process. After this, a photoresist layer 28 is formed over the entire WSi layer 27, and is then selectively removed to expose the area of the WSi layer 27 directly located above the tunneling oxide layer 24a.

Figure 2C:
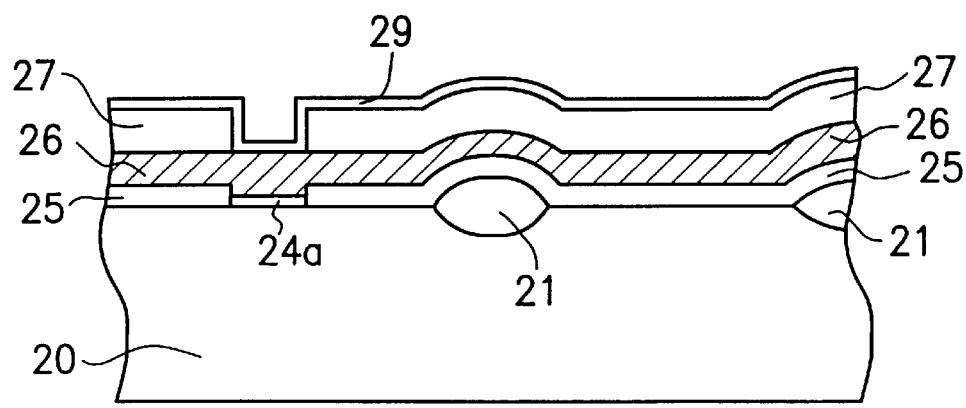

FIG. 2C shows the subsequent step, in which the photoresist layer 28 is used as a ask to perform an anisotropic etch-back process on the wafer, whereby the exposed portion of the WSi layer 27 that is unmasked by the photoresist layer 28 is etched away until the top surface of the polysilicon layer 26 is exposed. After this, the photoresist layer 28 is removed. Subsequently, an optional screen oxide layer 29 is formed over the entire wafer, which covers all the exposed surfaces of the WSi layer 27 and the polysilicon layer 26, but still leaving an empty space in the hole left by the removed portion of the WSi layer 27. The adhesion of the WSi layer 27 to the polysilicon layer 26 is poor, and the screen oxide layer 29 can prevent the WSi layer 27 from peeling away from the polysilicon layer 26. The provision of the screen oxide layer 29 is elective.

Figure 2D:
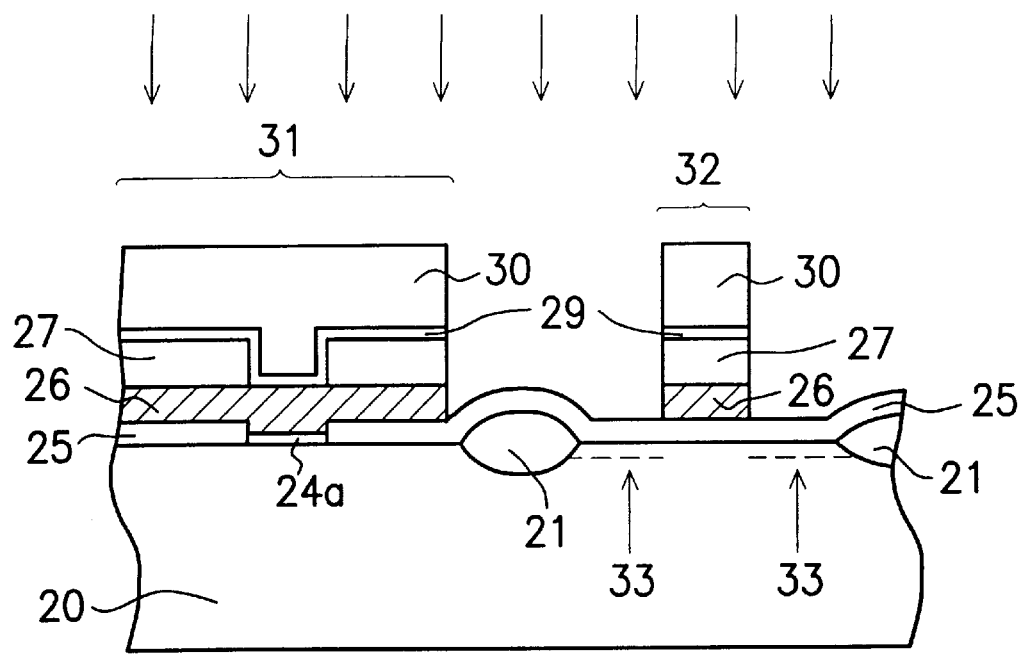

FIG. 2D shows the subsequent step, in which a photolithographic and etching process is performed on the wafer using a photoresist layer 30 as a mask, whereby selected portions of the screen oxide layer 29, the WSi layer 27, and the polysilicon layer 26 are removed. The combination of the remaining portions of the polysilicon layer 26 and WSi layer 27 that lie above the tunneling oxide layer 24a serves as a floating gate 31, while the combination of the remaining portions of the same that are laid on the other side of the field oxide layer 21 serves as a gate 32. After this, a high-voltage ion-implantation (HVI) process is performed on the wafer so as to dope an impurity element of a second semiconductor type (which is N-type in the case of the substrate 20 being P-type and P-type in the case of the substrate 20 being N-type) into the unmasked areas 33 in the substrate 20 on both sides of the gate 32 (i.e., those areas in the substrate 20 that are unmasked by the photoresist layer 30 and the field oxide layer 21).

Figure 2E:
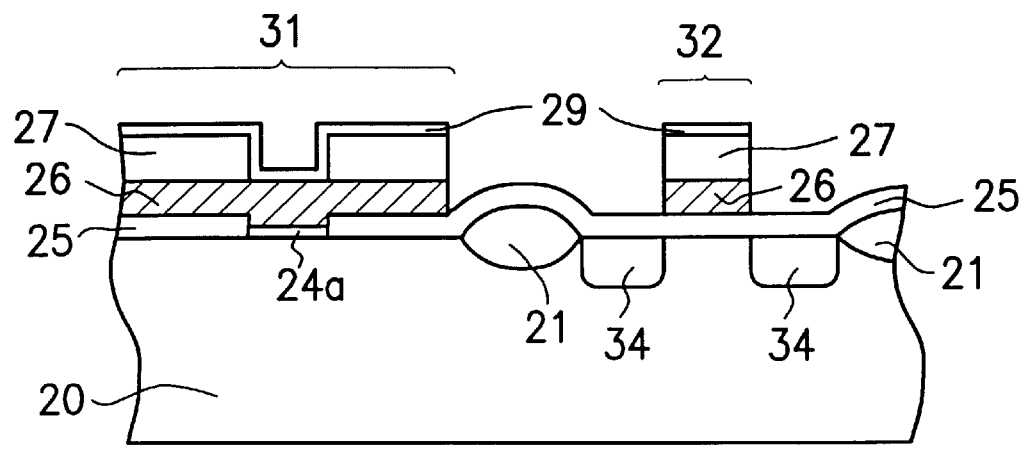

FIG. 2E shows that after the HVI process is completed, the photoresist layer 30 is first removed, and then a heat-treatment process is performed on the wafer so as to drive those impurity ions in the substrate 20 into the areas 33 (FIG. 2D). Through this process, the areas 33 are formed into a pair of source/drain regions 34.

The subsequent steps to finish the fabrication of the EEPROM device are all conventional techniques that are not within the spirit of the invention, so description thereof will not be further detailed.

It is a characteristic part of the invention, in contrast to the prior art, that the portion of the WSi layer that is directly laid above the tunneling oxide layer is removed. As a result, in the subsequent heat-treatment process, the degradation in the quality of the tunneling oxide layer that occurs in the prior art due to the forming of a trapping center therein can be prevented. The tunneling oxide layer is thus more assured in quality, allowing the resultant EEPROM to operate reliably with high performance.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating an EEPROM device, comprising:

(1) preparing a substrate of a first semiconductor type, then forming a field oxide layer on the substrate;

(2) forming a first oxide layer over the substrate, which is then selectively removed to form a tunneling window to expose a selected area on the substrate;

(3) forming a second oxide layer, which covers the first oxide layer and the area of the substrate exposed by the tunneling window, with the part of the second oxide layer filling the tunneling window serving as a tunneling oxide layer, and with all the other parts of the second oxide layer and the underlying first oxide layer serving as a gate oxide layer;

(4) forming a polysilicon layer, which covers over the entire gate oxide layer and the tunneling oxide layer, and then forming a layer of tungsten silicide over the entire polysilicon layer;

(5) removing a selected portion of the tungsten silicide layer that is laid directly above the tunneling oxide layer;

(6) removing selected portions of the polysilicon layer and the underlying tungsten silicide layer so as to form a floating gate on the tunneling oxide layer and a gate on the gate oxide layer; and (7) performing an HVI process so as to dope an impurity element of a second semiconductor type into the substrate, and then performing a heat-treatment process so as to form a pair of source/drain regions in the substrate on both sides of the gate.

2. The method of claim 1, wherein the first semiconductor type is P-type, while the second semiconductor type is N-type.

3. The method of claim 1, wherein the first semiconductor type is N-type, while the second semiconductor type is P-type.

4. The method of claim 1, wherein in the step (2), the first oxide layer is a layer of silicon dioxide.

5. The method of claim 1, wherein in the step (3), the second oxide layer is a layer of silicon dioxide formed through a CVD process.

6. The method of claim 1, wherein in the step (4), the tungsten silicide layer is formed through a CVD process.

7. The method of claim 1, wherein the step (5) further comprises a substep of forming a screen oxide layer, which covers the tungsten silicide layer and the exposed surface of the polysilicon layer.

8. The method of claim 7, wherein the screen oxide layer is a layer of silicon dioxide.

* * * * *